United States Patent
Washida et al.

[11] Patent Number: 5,949,135
[45] Date of Patent: Sep. 7, 1999

[54] MODULE MOUNTED WITH SEMICONDUCTOR DEVICE

[75] Inventors: Tetsuro Washida; Katsunori Ochi, both of Tokyo, Japan

[73] Assignee: Mitsubishi Denki Kabushiki Kaisha, Tokyo, Japan

[21] Appl. No.: 08/991,485

[22] Filed: Dec. 16, 1997

[30] Foreign Application Priority Data

Jul. 15, 1997 [JP] Japan .................................... 9-190031

[51] Int. Cl.⁶ .................................................. H01L 23/02
[52] U.S. Cl. ........................... 257/685; 257/723; 257/777
[58] Field of Search ..................................... 257/777, 778, 257/723, 685, 686, 724

[56] References Cited

U.S. PATENT DOCUMENTS 5,614,766  3/1997  Takasu et al. ........................... 257/723
5,744,862  4/1998  Ishii ........................................ 257/723

FOREIGN PATENT DOCUMENTS

A-5-82582   4/1993  Japan .
A-6-5778    1/1994  Japan .
A-6188362   7/1994  Japan .

Primary Examiner—Peter Toby Brown
Assistant Examiner—Roy Potter

[57] ABSTRACT

A module mounted in relative high density with semiconductor devices is disclosed. The module includes a mounting substrate which has a hole section; a first semiconductor device having bump electrodes which protrude from one principal surface of a package and lead terminals electrically connected to the bump electrodes; a second semiconductor device which also has bump electrodes that can be structurally and electrically coupled with the bump electrodes of the first semiconductor device and where this second semiconductor device is able to be located in the hole section of the mounting substrate, and where the first semiconductor device is able to be supported on the mounting substrate through the lead terminals; and where the bump electrodes of both semiconductor devices are electrically connected to each other.

4 Claims, 10 Drawing Sheets

MODULE MOUNTED WITH SEMICONDUCTOR DEVICE

BACKGROUND OF THE INVENTION

The present invention relates to a module mounted with semiconductor devices, and in particular, to a module mounted in high density with semiconductor devices having at least one bump electrode.

FIG. 14 is a sectional view showing a part of a conventional semiconductor device having bump electrodes disclosed in, for example, the document of Japanese Patent Laid-Open Publication No. HEI 5-82582 (referred to as a first conventional art hereinafter). In FIG. 14 are shown a semiconductor substrate 1001, bonding pads 1002 placed on the semiconductor substrate 1001, bump electrodes 1003 formed on the bonding pads 1002 and a mold resin 1004. According to this conventional art semiconductor device having bump electrodes, the bump electrodes 1003 connected to an external circuit are formed perpendicularly on the bonding pads 1002 placed on the semiconductor substrate 1001, allowing the external dimensions of the semiconductor device to be reduced to about the dimensions of the semiconductor substrate 1001.

It is to be noted, in this specification, that the term "semiconductor device" Primarily indicates "one electronic component formed by encapsulating a semiconductor chip, at least one electrically wired electrode (e.g., bump electrode) and so forth in a resin and packaging the same". The term "module" basically indicates "a complete product whose substrate is mounted with one or a plurality of electronic components". Further, the term "package" means "a method of forming one electronic component or a configuration of the formed product itself".

When mounting a semiconductor device (see FIG. 15, for example) whose substrate is provided with bump electrodes as described above on a mounting substrate, it has been common to connect bump electrodes 1153 to respective bonding pads 1152 placed on a mounting substrate 1100 by, for example, soldering (this is referred to as a second conventional art hereinafter) as shown in FIG. 16. In this case, the semiconductor device 1150 is directly mounted on the surface of the mounting substrate 1100, and therefore, the mounting density can be increased more than in the case where semiconductor devices are mounted one by one on a substrate via lead terminals.

Further, for example, the document of Japanese Patent Laid-Open Publication No. HEI 6-188362 (this referred to as a third conventional art hereinafter) discloses a semiconductor device mounting structure in which the mounting density is increased by connecting two semiconductor devices in a stacked manner and fixing the integrated two semiconductor devices to a mounting substrate via lead terminals. According to this third conventional art, two semiconductor devices can be mounted in an area required for mounting one semiconductor device.

Furthermore, for example, the document of Japanese Patent Laid-Open Publication No. HEI 6-5778 (this referred to as a fourth conventional art hereinafter) discloses a semiconductor device in which a plurality of semiconductor chips are arranged in a three-dimensional configuration metal bump is used for insulating and heat radiating benefits for improving bonding strength, and for allowing the semiconductor chips to be easily aligned in position.

However, each of the first, second and fourth conventional arts disclose only a general effect produced by the use of the bump electrode in regard to the improvement of the mounting density of semiconductor devices on the mounting substrate and disclose nothing about the structure for further improving the mounting density of semiconductor devices having bump electrodes.

That is, the aforementioned first conventional art discloses only a measure for compacting the external dimensions of the semiconductor device by means of bump electrodes, while the second conventional art discloses only a measure for directly mounting a semiconductor device on a mounting substrate by means of bump electrodes. Lastly, the fourth conventional art discloses only a three-dimensional arrangement structure of semiconductor devices employing bump electrodes.

The third conventional art can indeed improve the semiconductor device mounting density per unit area of the substrate to a certain extent by mounting two semiconductor devices in a stacked manner on a mounting substrate. Even the third conventional art cannot achieve a mounting density higher than the above. Furthermore, in this configuration, the two semiconductor devices are held above the substrate in a suspended state via the lead terminals, and therefore, the semiconductor devices protrude high above the substrate, also leading to a disadvantage in compacting the module.

SUMMARY OF THE INVENTION

Accordingly, the object of the present invention is to obtain a module in which semiconductor devices having bump electrodes are mounted in high density, allowing the mounting density to be increased.

In order to achieve the above object, a module according to a first aspect of the present invention comprises: a mounting substrate provided with a hole section which can lodge therein a specified semiconductor device; a first semiconductor device having bump electrodes which are formed as protruded from one principal surface of a package and lead terminals electrically connected to the bump electrodes; a second semiconductor device which has bump electrodes to be combined with the bump electrodes of the first semiconductor device and is able to be lodged in the hole section, the second semiconductor device being lodged in the hole section, the first semiconductor device being supported by the mounting substrate via the lead terminals in a position in which its bump electrodes are superposed on the bump electrodes of the second semiconductor device, and the bump electrodes of both semiconductor devices are electrically connected to each other.

According to the first aspect of the present invention, the bump electrodes of the first and second semiconductor devices are connected to each other structurally and electronically, and therefore, the second semiconductor device is structurally supported by the first semiconductor device. Then, by arranging the first semiconductor device in a position corresponding to the hole section and supporting the first semiconductor device on the mounting substrate via the lead terminals, the first semiconductor device can be mounted above the second semiconductor device in the state in which the second semiconductor device is lodged in the hole section. That is, the semiconductor devices can be mounted in two tiers taking advantage of the thickness of the mounting substrate, allowing a relatively compact module having a higher mounting density.

Further, a module according to a second aspect of the present invention comprises: a mounting substrate provided with a hole section which can lodge therein a specified semiconductor device; a first semiconductor device having upper and lower bump electrodes which protrude from an upper surface and a lower surface of a package and a lead terminal electrically connected to the bump electrodes; a second semiconductor device which has bump electrodes to be combined with either one of the upper and lower bump electrodes of the first semiconductor device and is able to be lodged in the hole section; and a third semiconductor device having bump electrodes to be combined with the other one of the upper and lower bump electrodes of first semiconductor device, the second semiconductor device being lodged in the hole section, the first semiconductor device being supported by the mounting substrate via the lead terminals in a position in which one of the upper and lower bump electrodes are superposed on the bump electrode of the second semiconductor device, the third semiconductor device being located in a position in which its bump electrodes are superposed on the other one of the upper and lower bump electrodes of the first semiconductor device, and one of bump electrodes of the first semiconductor device and the other of bump electrodes of the first semiconductor device being connected respectively to the bump electrodes of the second semiconductor device and the bump electrodes of the third semiconductor device with electronic continuity secured between them.

According to the second aspect of the present invention, one of the upper and lower bump electrodes of the first semiconductor device and the other of the upper and lower bump electrodes of the first semiconductor device are connected respectively to the bump electrodes of the second semiconductor device and the bump electrodes of the third semiconductor device with electronic continuity secured between them. Thus, the second and third semiconductor devices are both supported by the first semiconductor device. Then, by arranging the first semiconductor device in a position corresponding to the hole section and supporting the first semiconductor device on the mounting substrate via the lead terminals, the first semiconductor device can be mounted above the second semiconductor device and the third semiconductor device can be further mounted on the first semiconductor device in the state in which the second semiconductor device is lodged in the hole section. That is, the semiconductor devices can be mounted in three tiers taking advantage of the thickness of the mounting substrate, allowing a relatively compact obtained.

Furthermore, a module according to a third aspect of the present invention is characterized in that at least either one of the second or third semiconductor devices has upper and lower bump electrodes which protrude respectively from the upper and lower surfaces of the package, and at least one other semiconductor device is mounted in a stacked manner.

According to the third aspect of the present invention, an effect similar to that of the second aspect of the present invention can be produced. In this aspect of the invention, at least one of the second or third semiconductor devices has upper and lower bump electrodes protrude from the upper and lower surfaces of the package, and at least one other semiconductor device is mounted in a stacked manner. Therefore, a still higher mounting density can be achieved.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS (First Embodiment)

A module mounted with a semiconductor device according to a first embodiment of the present invention will be described below.

Figure 1:
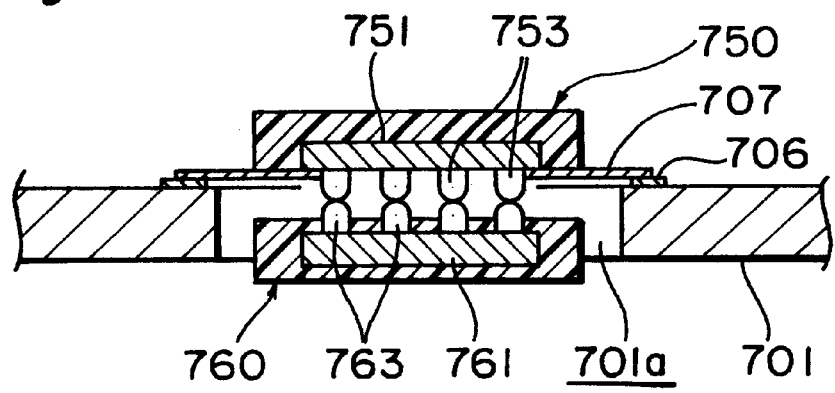
FIG. 1 is a sectional view of a part of a module according to a first embodiment of the present invention.

FIG. 1 is a sectional view of a part of a module of the first embodiment of the present invention.

As shown in this figure, the module of the present embodiment includes a mounting substrate 701 provided with a hole section 701a which can lodge therein a specified semiconductor device (a second semiconductor device 760), a first semiconductor device 750 having bump electrodes 753 which protrude from one principal surface of a package and at least one pair of lead terminals 707 electrically connected to the bump electrodes 753 and a second semiconductor device 760 which has bump electrodes 763 to be combined with the bump electrodes 753 of the first semiconductor device 750 and is able to be lodged in the hole section 701a.

First, the bump electrodes 753 and 763 of the first and second semiconductor devices 750 and 760 are connected to each other electrically by, for example, soldering. In connecting these bump electrodes 753 and 763 to each other, it is preferable to flatten to a certain degree the top portions of the spherical surfaces of the bump electrodes 753 and 763, then temporarily fix them together with an adhesive having a flux property and thereafter solder the same.

Next, the first semiconductor device 750 is arranged, for example, above the hole section 701a. With this arrangement, the second semiconductor device 760 is lodged in the hole section 701a.

Then, in this state, the lead terminals 707 of the first semiconductor device 750 are connected to the respective lands 706 on the mounting substrate 701, so that the first semiconductor device 750 is supported by the mounting substrate 701 via the lead terminals 707. In this case, the lead terminals 707 and the lands 706 are connected to each other with electronic continuity secured between them by, for example, soldering. In this stage, since the bump electrodes 753 and 763 are connected to each other, the second semiconductor device 760 is supported by the first semiconductor device 750 in a state in which it is lodged in the hole section 701a.

It is to be noted that the process of connecting the lead terminals to the mounting substrate and the process of connecting the bump electrodes to each other may be executed in reverse order.

As described above, since the bump electrodes 753 and 763 of the first and second semiconductor devices 750 and 760 are electrically connected to each other, the second semiconductor device 760 is supported by the first semiconductor device 750. Then, by arranging the first semiconductor device 750 in a position corresponding to the hole section 701a and supporting the first semiconductor device 750 on the mounting substrate 701 via the lead terminals 707, the first semiconductor device 750 can be mounted above the second semiconductor device 760 in the state in which the second semiconductor device 760 is lodged in the hole section 701a.

That is, the semiconductor devices 750 and 760 can be mounted in two tiers taking advantage of the thickness of the mounting substrate 701, allowing a relatively compact module having a higher mounting density to be obtained.

(Second Embodiment)

Figure 2:
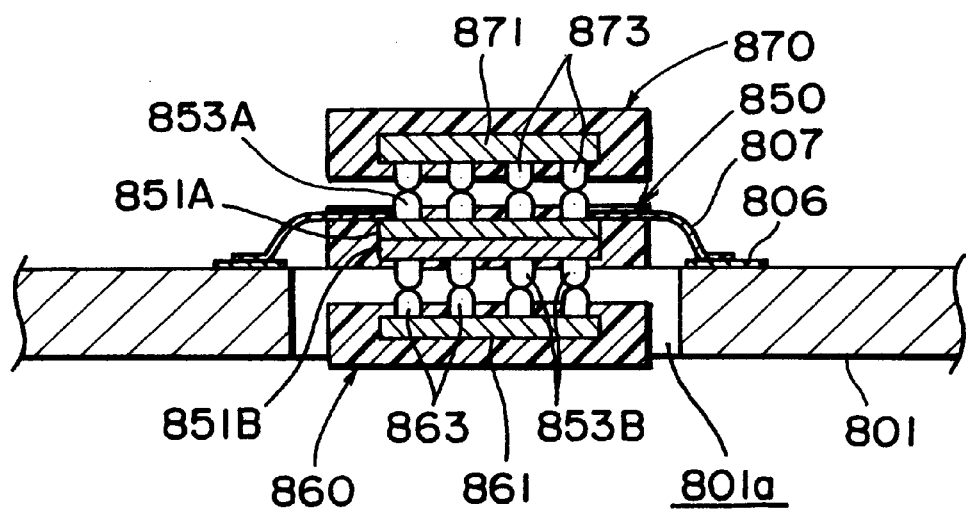
FIG. 2 is a sectional view of a part of a module according to a second embodiment of the present invention.

FIG. 2 is a sectional view of a part of a module according to a second embodiment of the present invention.

As shown in this figure, the module of the present embodiment includes a mounting substrate 801 provided with a hole section 801a which can lodge therein a specified semiconductor device (a second semiconductor device 860) and a first semiconductor device 850 having upper and lower bump electrodes 853A and 853B which protrude respectively from the upper and lower surfaces of the package and at least one pair of lead terminals 807 which are electrically connected to either one of these bump electrodes 853A and 853B. This first semiconductor device 850 has a semiconductor substrate 851A electrically connected to the bump electrodes 853A and a semiconductor substrate 851B electrically connected to the bump electrodes 853B.

The above-mentioned module is further provided with a second semiconductor device 860 which has bump electrodes 863 to be combined with either one (the lower bump electrodes 853B in the present embodiment) of the upper and lower bump electrodes 853A and 853B and is able to be lodged in the hole section 801a and a third semiconductor device 870 which has bump electrodes 873 to be combined with the other one (the upper bump electrodes 853A in the present embodiment) of the upper and lower bump electrodes 853A and 853B of the first semiconductor device 850.

First, the lower bump electrodes 853B of the first semiconductor device 850 and the upper bump electrodes 853A of the first semiconductor device 850 are connected respectively to the bump electrodes 863 of the second semiconductor device 860 and the bump electrodes 873 of the third semiconductor device 870 with electrical connectivity between them by, for example, soldering. In connecting these bump electrodes to each other, it is preferable to flatten to a certain degree the top portions of the spherical surfaces of the bump electrodes 853A, 853B, 863 and 873, then temporarily fix them together with an adhesive having a flux property and thereafter solder the same.

Next, the first semiconductor device 850 is arranged, for example, above the hole section 801a. With this arrangement, the second semiconductor device 860 is lodged in the hole section 801a. Then, in this state, the lead terminals 807 of the first semiconductor device 850 are connected to the respective lands 806 on the mounting substrate 801, so that the first semiconductor device 850 is supported by the mounting substrate 801 via the lead terminals 807. In this case, the lead terminals 807 and the lands 806 are connected to each other with electronic continuity secured between them by, for example, soldering. In this stage, since the bump electrodes 853B and 863 are connected to each other, the second semiconductor device 860 is supported by the first semiconductor device 850 in a state in which the second semiconductor device 860 is lodged in the hole section 801a. Further, since the bump electrodes 853A and 873 are connected to each other, the third semiconductor device 870 is supported by the first semiconductor device 850 above the first semiconductor device 850.

It is to be noted that the process of connecting the lead terminals to the mounting substrate and the process of connecting the bump electrodes to each other may be executed in reverse order.

As described above, since the one side of (lower) bump electrode 853B of the first semiconductor device 850 and the other side of (upper) bump electrode 853A of the first semiconductor device 850 are connected respectively to the bump electrodes 863 of the second semiconductor device 860 and the bump electrodes 873 of the third semiconductor device 870 with electronic continuity secured between them, the second and third semiconductor devices 860 and 870 are both supported by the first semiconductor device 850. Then, by arranging the first semiconductor device 850 in a position corresponding to the hole section 801a and supporting the first semiconductor device 850 on the mounting substrate 801 via the lead terminals 807, the first semiconductor device 850 can be mounted above the second semiconductor device 860 and the third semiconductor device 870 can be further mounted on the first semiconductor device 850 in the state in which the second semiconductor device 860 lodged in the hole section 801a.

That is, the semiconductor devices 850, 860 and 870 can be mounted in three tiers taking advantage of the thickness of the mounting substrate 801, allowing a relatively compact module having a still higher mounting density to be obtained.

In this second embodiment, it is acceptable to provide at least one of the second and third semiconductor devices 860 and 870 by a semiconductor device having upper and lower bump electrodes which protrude on the upper and lower surfaces of the package and mount them with at least one other semiconductor device in a stacked manner.

Figure 3:
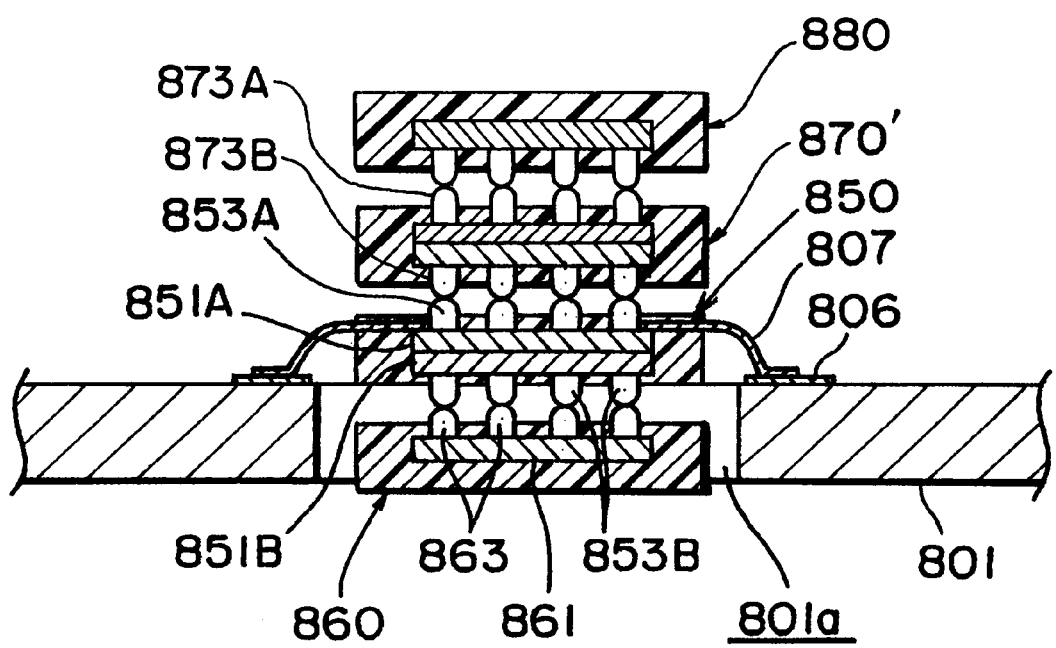
FIG. 3 is a sectional view of a part of a module according to a modified example of the second embodiment of the present invention.

A modified example of the second embodiment is shown in FIG. 3. In this example, the third semiconductor device 870' is provided as a semiconductor device having upper and lower bump electrodes 873A and 873B which are formed as protruded on the upper and lower surfaces of the package, and is mounted with the other semiconductor device 880 in a stacked manner.

In this case, a still higher mounting density can be achieved.

Next, some examples of the semiconductor devices having upper and lower bump electrodes which protrude on the upper and lower surfaces of the package, which can be used in the second embodiment and its modified example, will be described below.

Figure 4:
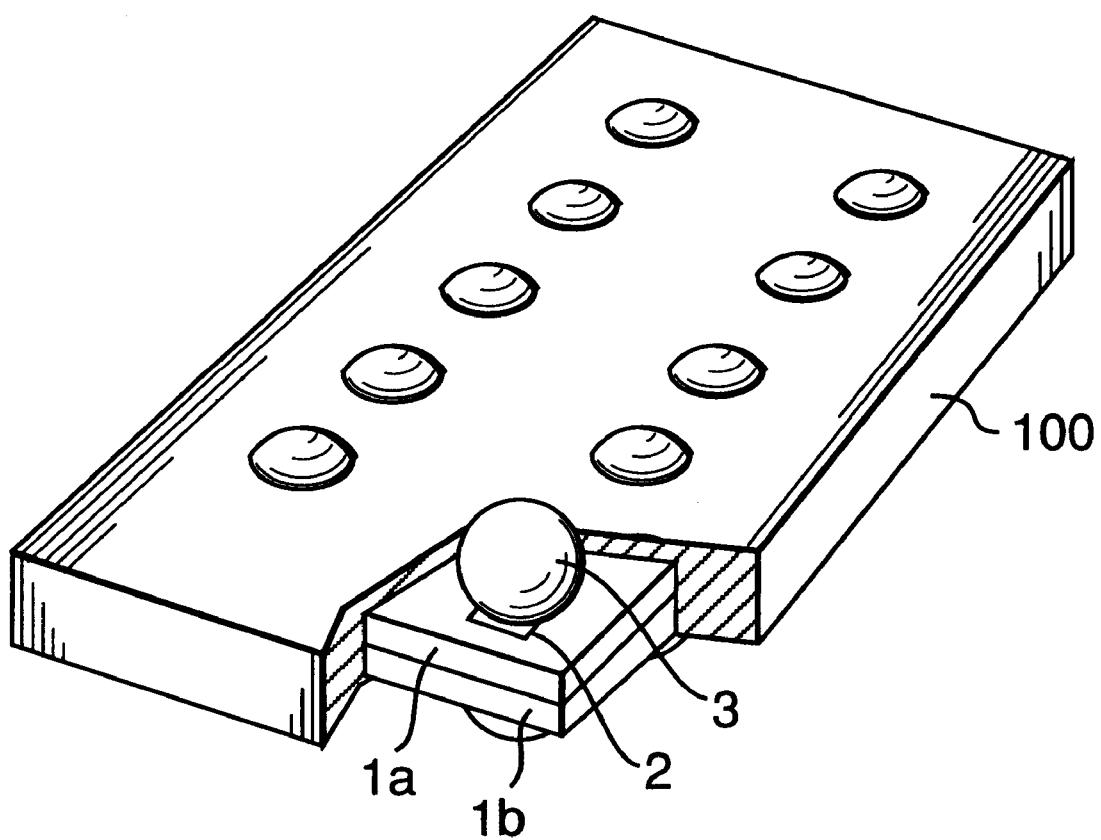
FIG. 4 is a perspective partial cross sectional view of an example of a semiconductor device which may be used in the second embodiment of the present invention with an even number of bump electrodes.

FIG. 4 is a perspective partial cross sectional view of an example of a semiconductor device which can be used in the second embodiment and its modified example, with an even number of bump electrodes. With reference to FIG. 4, the semiconductor device comprises a pair of first and second semiconductor substrates 1a and 1b stacked with each other and packaged with a molding resin so that part of each bump electrode 3 is exposed from upper and lower surfaces of the molding package 100. Each of the first and second semiconductor substrates has a plurality of bonding pads 2 arranged on one principal plane which is not stacked with each other. These bonding pads 2 electrically connect between respective bump electrodes 3 and corresponding electrodes (not shown) provided on each of the principal planes of the first and second substrates 1a and 1b.

Figure 5:
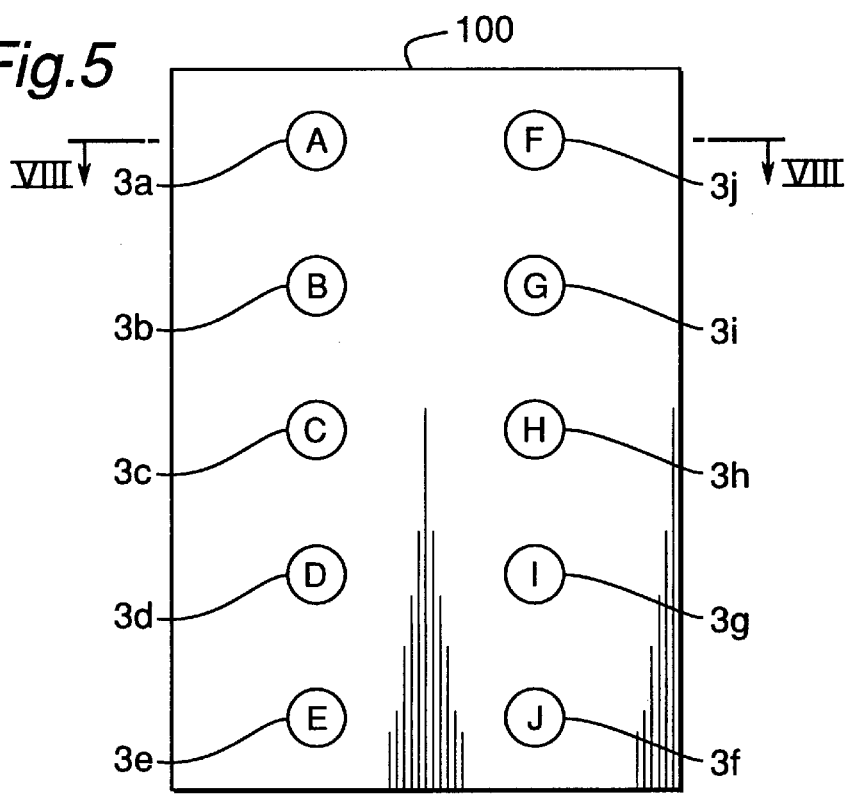
FIG. 5 is a top view of the semiconductor device shown in FIG. 4.

The arrangement pattern of bonding pads 2, and, correspondingly, that of bump electrodes 3 is the same between the first and second substrates 1a and 1b, as shown in FIGS. 5 and 3. However, circuits arranged on the second semiconductor substrate 1b are designed so that signals to be input into or output from that semiconductor through corresponding bump electrodes are in mirror symmetry with those of the first semiconductor substrate 1a. This will be explained in more detail below.

FIG. 5 is a top view of the semiconductor device shown in FIG. 4. With reference to FIG. 5, bump electrodes on the top of the package 100 are arranged so that they correspond to the input/output terminals of the internal circuits of the semiconductor substrate 1a. The signals on those bump electrodes 3a–3j of the top surface of the package 100 are denoted as A–J. FIG. 3 is a bottom view of the semiconductor device shown in FIG. 4. As apparent from comparison of FIG. 6 with FIG. 5, signals A–J of the second semiconductor substrate 1b, which are same as those of the first semiconductor substrate 1a, are output from or input into the second semiconductor substrate 1b through bump electrodes 3a–3j which are arranged in mirror symmetry with those 3a–3j on the side of the first semiconductor substrate 1a. This ensures that, even when the semiconductor device is reversed in up and down orientation, the same signals are obtained at respective bump electrode positions as before reversing the orientation of the semiconductor device.

Figure 7:
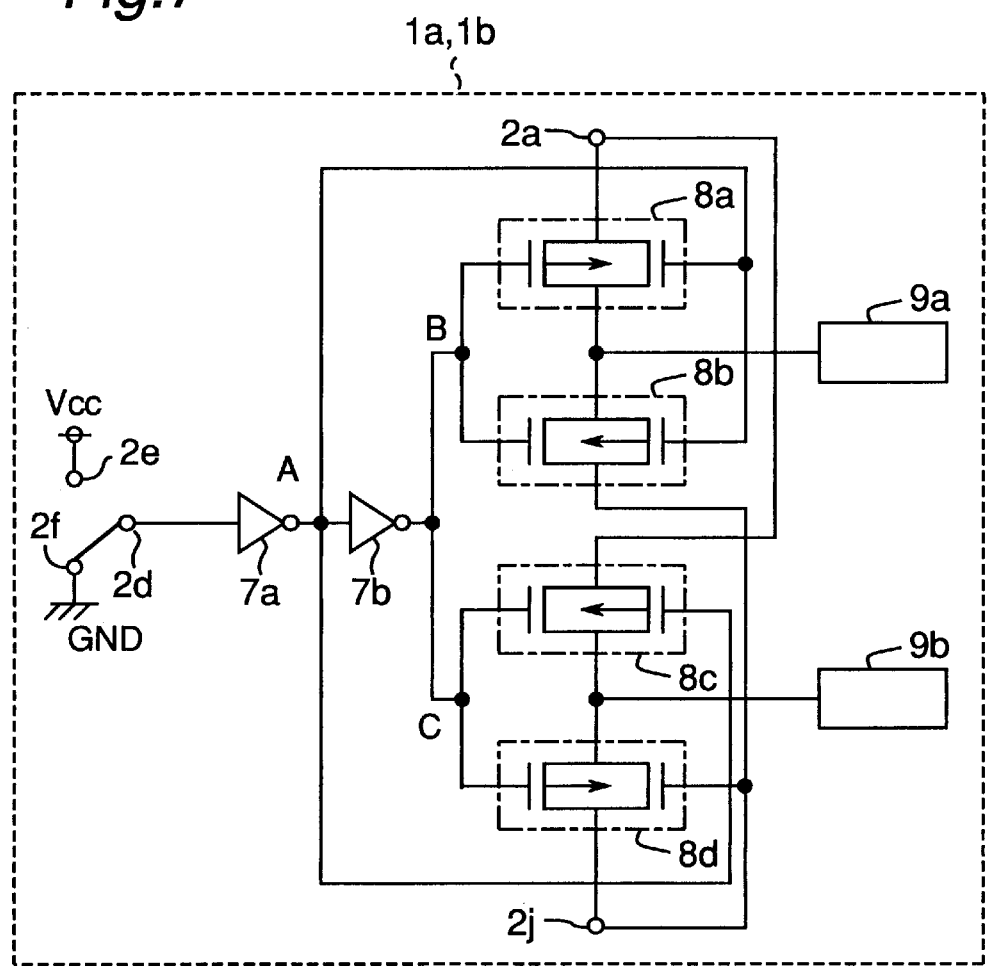
FIG. 7 shows partial circuits of the semiconductor substrates of the semiconductor device shown in FIG. 4.

FIG. 7 shows partial circuits of the semiconductor substrates 1a and 1b. With reference to FIG. 7, each of the semiconductor substrates 1a and 1b includes internal circuits 9a and 9b, transfer gates 8a and 8b for receiving signals from the internal circuits 9a, and transfer gates 8c and 8d for receiving signals from the internal circuits 9b. The outputs from the transfer gates 8a and 8c are transferred to a bonding pad, for example, 2a; and the outputs from the transfer gates 8b and 8d are transferred to a bonding pad, for example 2j. One of the two gates of the transfer gate 8a and the corresponding gate of the transfer gate 8b are both connected to a node B. Likewise, one of the two gates of the transfer gate 8c and the corresponding gate of the transfer gate 8d are both connected to a node C. The nodes B and C receive input signals through an inverter circuit 7b. The other gates of the respective transfer gates 8a, 8b, 8c, and 8d are combined together and connected to a node A, which receives input signals through an inverter circuit 7a. The inverter circuit 7a is connected to the inverter circuit 7b on one end and to a bonding pad 2d on the other. This circuit also includes a power supply pad 2e for receiving a power supply voltage Vcc and a ground pad 2f for connecting the circuit to the ground voltage GND. The pad 2d is connected to either the pad 2e or 2f through a conductive layer formed in the assembly process.

The operation of the circuit will be described next. In a case in which the bonding pad 2d of the semiconductor substrate 1a is connected to the ground pad 2f through a conductive layer formed in the assembly process, the low level voltage is applied to the nodes B and C through the inverter circuits 7a and 7b. Then one of the gates (the left gate in FIG. 7) of each of the transfer gates 8a, 8b, 8c, and 8d receives the low level voltage. The other gate (the right gate in FIG. 7) of each of the transfer gates 8a, 8b, 8c, and 8d becomes high through the node A. Therefore, the transfer gates 8a and 8d are on and the transfer gates 8b and 8c are off. Accordingly, the output signal from the internal circuit 9a is output to the bonding pad 2a through the transfer gate 8a, and the output signal from the internal circuit 9b is output to the bonding pad 2j through the transfer gate 8d.

In a case in which the bonding pad 2d of the semiconductor substrate 1b is connected to the power supply pad 2e of the voltage Vcc through a conductive layer formed in the assembly process, the high level voltage is applied to the nodes B and C through the inverter circuits 7a and 7b. Then one of the two gates (the left gate in FIG. 7) of each of the transfer gates 8a, 8b, 8c, and 8d receives the high level voltage. The other gate (the right gate in FIG. 7) of each of the transfer gates 8a, 8b, 8c, and 8d becomes low through the node A. Therefore, the transfer gates 8a and 8d are off, and the transfer gates 8b and 8c are on. Accordingly, the output signal from the internal circuit 9a is output to the bonding pad 2j through the transfer gate 8b, and the output signal from the internal circuit 9b is output to the bonding pad 2a through the transfer gate 8c. Thus the reversed signals to the normal signals can be obtained at the bonding pads.

Figure 8:
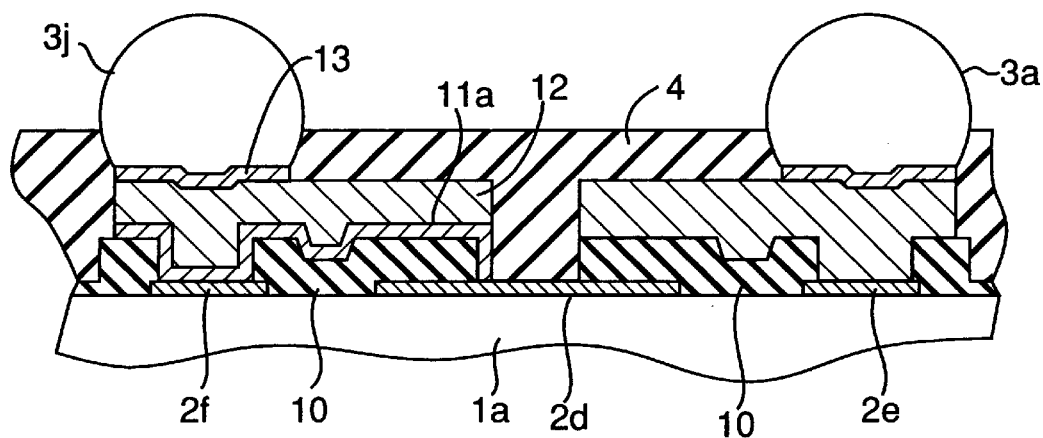
FIG. 8 is a partial cross section of the semiconductor d ice shown in FIG. 5 along the line VIII—VIII.

FIG. 8 is a partial cross-sectional view of the semiconductor device along the line VIII—VIII of FIG. 5. This diagram shows the bonding pad 2d and the ground pad 2f connected to each other as shown in FIG. 7. This connection is made during the assembly process. With reference to FIG. 8, insulating layers 10 are formed between the bonding pad 2d and the ground pad 2f on the semiconductor substrate 1a and between the bonding pad 2d and the power supply pad 2e. A conductive layer 11a is formed on the insulating layer 10 between the bonding pad 2d and the ground pad 2f to connect the two pads. Then another conductive layer 12 is formed on the conductive layer 11a and also on the insulating layer 10 between the bonding pad 2d and the power supply pad 2e. Another conductive layer 13 is formed on each of the conductive layers 12, and the bump electrodes 3a and 3j are made on the conductive layers 13. Finally the semiconductor device is molded with resin 4.

Thus the bonding pad 2d and the ground pad 2f are connected by the conductive layer 11a.

Figure 6:
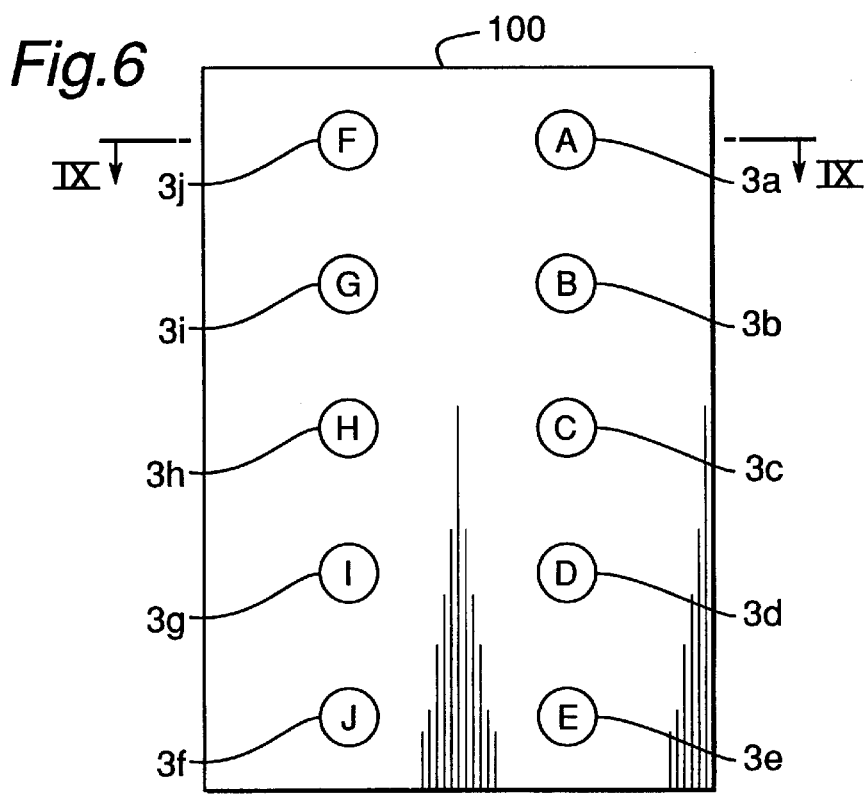
FIG. 6 is a bottom view of the semiconductor device shown in FIG. 4.
Figure 9:
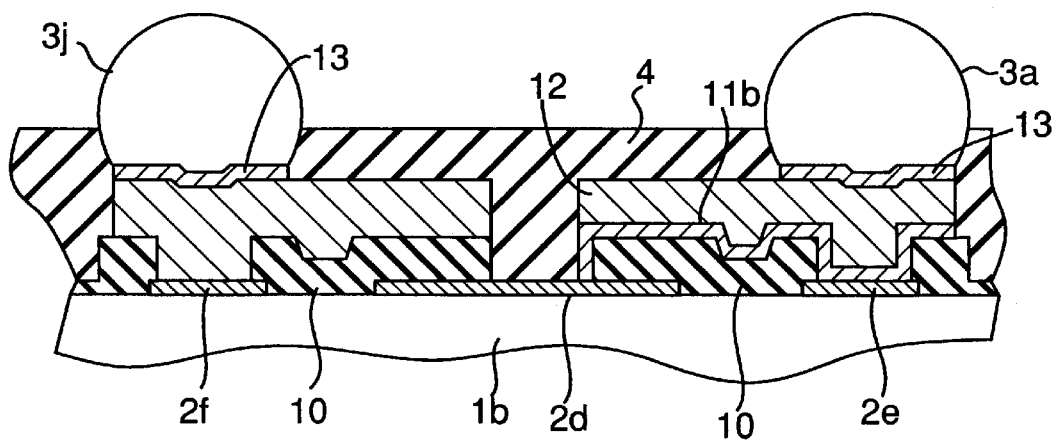
FIG. 9 is a partial cross section of the semiconductor device shown in FIG. 6 along the line IX—IX.

FIG. 9 is a partial cross-sectional view of the semiconductor device along the line IX—IX of FIG. 6. This diagram shows the bonding pad 2d and the power supply pad 2e of FIG. 7 connected to each other. This connection is made during the assembly process. With reference to FIG. 9, insulating layers 10 are formed between the bonding pad 2d and the ground pad 2f on the semiconductor substrate 1b and between the bonding pad 2d and the power supply pad 2e. A conductive layer 11b is formed on the insulating layer 10 between the bonding pad 2d and the power supply pad 2e to connect the two pads. Then another conductive layer 12 is formed on the conductive layer 11b and also on the insulating layer 10 between the bonding pad 2d and the ground pad 2f. Another conductive layer 13 is formed on each of the conductive layers 12, and the bump electrodes 3a and 3j are formed on the conductive layers 13. Finally the semiconductor device is molded with resin 4. Thus, the bonding pad 2d and the power supply pad 2e are connected by the conductive layer 11b.

Figure 10:
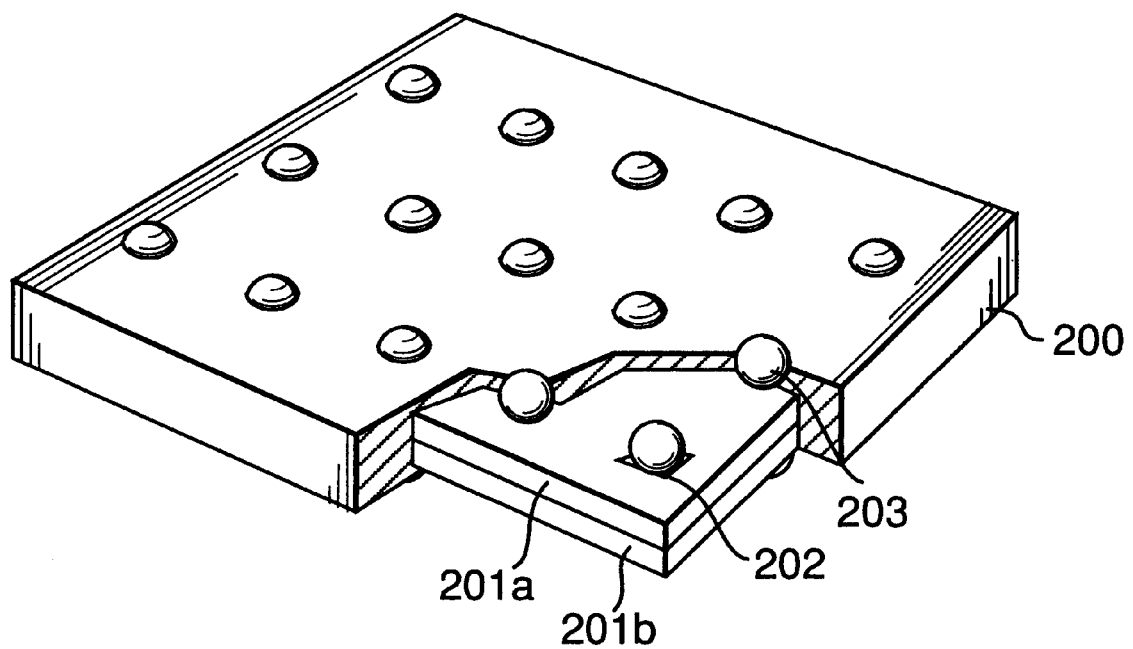
FIG. 10 is a perspective partial cross sectional view of another example of a semiconductor device which may be used in the second embodiment of the present invention with an odd number of bump electrodes.

FIG. 10 is a partially cut off perspective view of another example of semiconductor device which can be used in the second embodiment and its modified example, with an odd number of bump electrodes on each of the top and bottom surfaces thereof. With reference to FIG. 10, the semiconductor device includes a pair of semiconductor substrates 201a and 201b stacked with each other and a resin package 200 mold-packaging the stacked substrates therewithin. Similar to the semiconductor device shown in FIG. 4, the semiconductor substrates 1a and 1b are in mirror symmetry with each other in relation to the signals to be output or input.

A plurality of bonding pads 202 are formed on each of the semiconductor substrates 201a and 201b and bump electrodes 203 are formed on top of the bonding pads 202 so that part of each bump electrode is exposed from each of top and bottom surfaces of the package. Some of the bump electrodes 203 may not be connected to the semiconductor.

Figure 11:
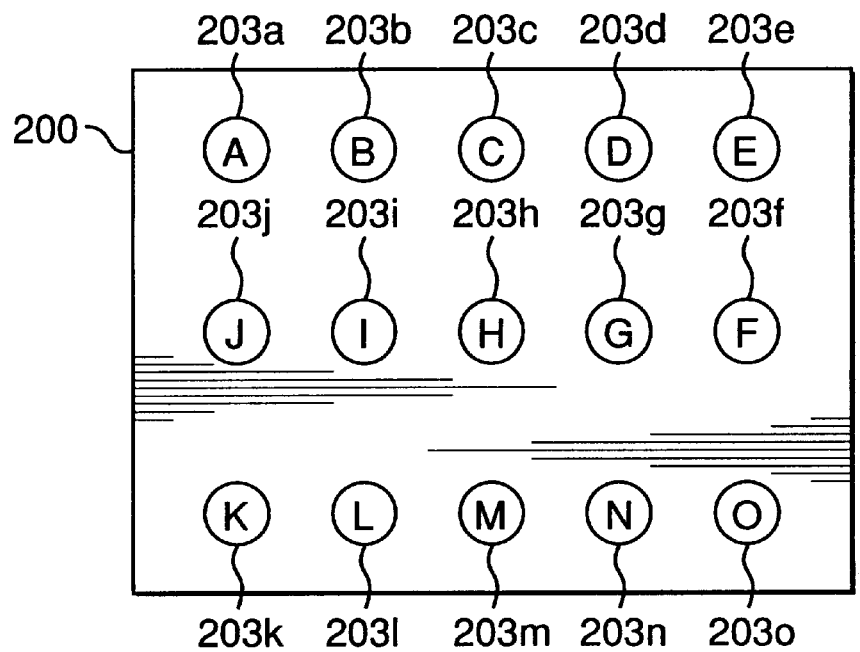
FIG. 11 is a top view of the semiconductor device shown in FIG. 10
Figure 12:
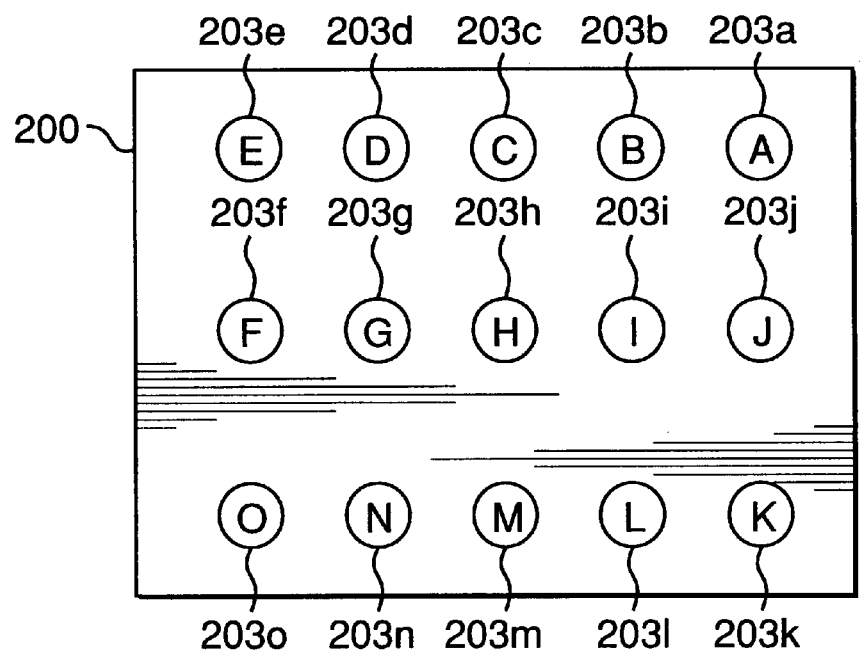
FIG. 12 is a bottom view of the semiconductor device shown in FIG. 10.

FIG. 11 is a top view of the package 200 shown in FIG. 7. With reference to FIG. 8, bump electrodes 203a–203o on the top of the package 200 are arranged so that they correspond to the input/output terminals of the internal circuits of the semiconductor substrate 1a. The signals delivered through those bump electrodes on the top surface of the package 200 are denoted as A–O. FIG. 12 is a bottom view of the semiconductor device shown in FIG. 10. As shown in FIG. 9, signals A–O to be output from or input into the semiconductor substrate 1b are in mirror symmetry with those of the semiconductor substrate 1a.

Figure 13:
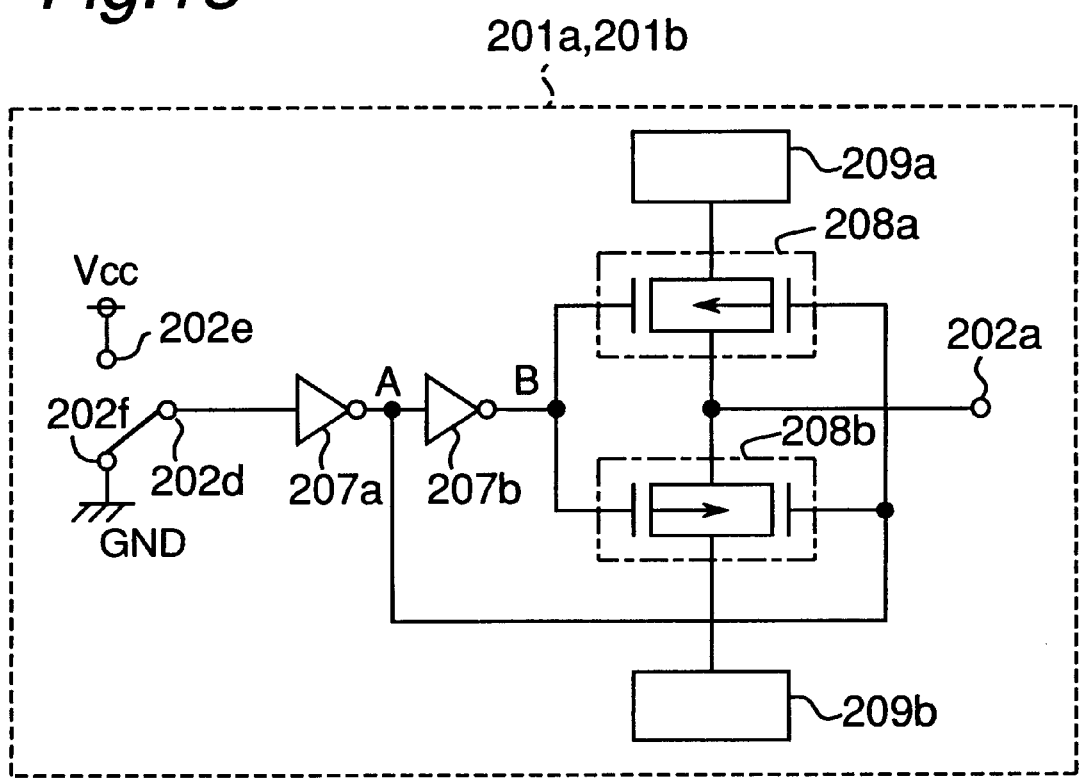
FIG. 13 shows partial circuits of the semiconductor substrates shown in FIG. 10.
Figure 14:
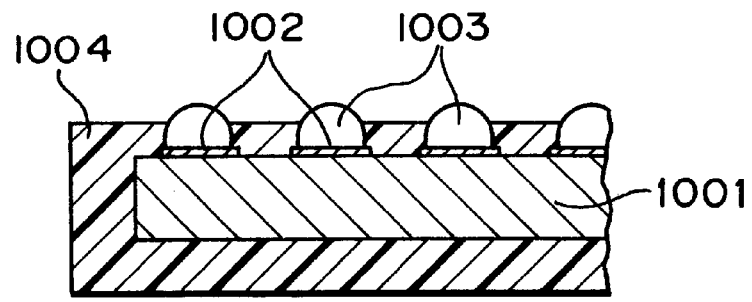
FIG. 14 is a sectional view of a part of a conventional art semiconductor device.
Figure 15:
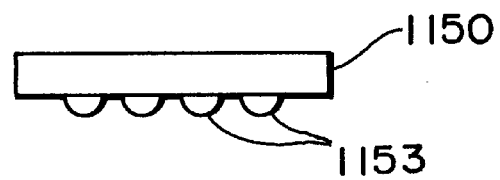
FIG. 15 is a side view of the conventional art semiconductor device.
Figure 16:
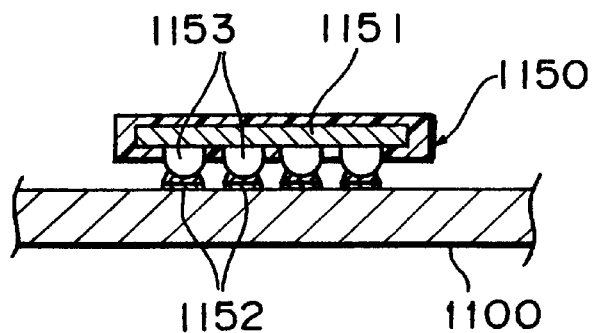
FIG. 16 is a sectional view of a part of a conventional art semiconductor device mounted on a mounting substrate.

FIG. 13 shows partial circuits of the semiconductor substrates 201a and 201b. With reference to FIG. 10, each of the semiconductor substrates 201a and 201b includes internal circuits 209a and 209b, transfer gates 208a and 208b for receiving signals from the internal circuits 209a and 209b respectively. The output from the internal circuits 209a or 209b is transferred to a bonding pad, for example 202a. One of the two gates of the transfer gate 208a and the corresponding gate of the transfer gate 208b are both connected to a node B which receives input signals through an inverter circuit 207b. The other gates of the respective transfer gates 208a and 208b are connected to a node A which receives input signals through an inverter circuit 207a. The inverter circuit 207a is connected to the inverter circuit 207b on one end and to a bonding pad 202d on the other. This circuit also includes a power supply pad 202e for receiving a power supply voltage Vcc and a ground pad 202f being connected to the ground voltage GND. The pad 202d is connected to either the pad 202e or 202f through a conductive layer formed in the assembly process.

The operation of the circuit will be described next. In a case in which the bonding pad 202d of the semiconductor substrate 201a is connected to the ground pad 202f through a conductive layer formed in the assembly process, the low level voltage is applied to the node B through the inverter circuits 207a and 207b. Then one of the two gates (the left gate in FIG. 13) of each of the transfer gates 208a and 208b receives the low level voltage. The other gate (the right gate in FIG. 13) of each of the transfer gates 208a and 208b becomes high through the node A. Therefore the transfer gates 208b are on. Accordingly the output signal from the internal circuit 209b is output to the bonding pad 202a through the transfer gate 208b.

In a case in which the bonding pad 202d of the semiconductor substrate 201b is connected to the power supply pad 202e of a voltage Vcc through a conductive layer formed in the assembly process, the high level voltage is applied to the node B through the inverter circuits 207a and 207b. Then one of the two gates (the left gate in FIG. 13) of each of the transfer gates 208a and 208b receives the high level voltage. The other gate (the right gate in FIG. 13) of each of the transfer gates 208a and 208b becomes low through the node A. Therefore, the transfer gate 208a is on and the transfer gate 208b is off. Accordingly, the output signal from the internal circuit 209a is output to the bonding pad 202a through the transfer gate 208a. Thus, the reversed signals to the normal signals can be obtained at the bonding pads. The implementation of the connections of the bonding pad to the ground pad or to the power supply pad is the same as shown in FIGS. 8 and 9.

The instant invention thus provides a more compact, thinner, stiffer, and denser semiconductor device than a conventional one which is merely combination of two separate semiconductor devices adhering on top of another, one corresponding to normal signals and the other corresponding to reversed signals.

The invention being thus described, it will be obvious that the same may be varied in many ways. Such variations are not to be regarded as departure from the spirit and scope of the invention, and all such modifications as would be obvious to one skilled in the art are intended to be included within the scope of the following claims.

What is claimed is:

1. A module comprising:

a mounting substrate having a recess/opening therein capable of accepting a semiconductor device;

a first semiconductor device having first bump electrodes which protrude from one principal surface of a package, and lead terminals electrically connected to the first bump electrodes; and a second semiconductor device having second bump electrodes that can be combined with the first bump electrodes of said first semiconductor device and which is able to be lodged in said recess/opening, said second semiconductor device being lodged in said recess/opening, said first semiconductor device being physically supported by the lead terminals connected to said mounting substrate in a position in which the first bump electrodes are superposed on the second bump electrodes of said second semiconductor device, and the first and second bump electrodes of both said first and second semiconductor devices being electrically connected to each other.

2. A module comprising:

a mounting substrate provided with a hole section which can lodge therein a specified semiconductor device;

a first semiconductor device having upper and lower bump electrodes which are formed as protrusions from an upper surface and a lower surface of a package and lead terminals electrically connected to the bump electrodes;

a second semiconductor device which has bump electrodes to be combined with either one of the upper and lower bump electrodes of said first semiconductor device and is able to be lodged in said hole section; and a third semiconductor device having bump electrodes to be combined with the other one of the upper and lower bump electrodes of said first semiconductor device, said second semiconductor device being lodged in said hole section, said first semiconductor device being supported on said mounting substrate by said lead terminals in a position in which either of the upper and lower bump electrodes are superposed on the bump electrodes of said second semiconductor, said third semiconductor device being located in a position in which its bump electrodes are superposed on the other of the upper and lower bump electrodes of said first semiconductor device, and the one bump electrodes of said first semiconductor device and the other bump electrodes of said first semiconductor device being connected respectively to the bump electrodes of said second semiconductor device and the bump electrodes of said third semiconductor device with electrical connectivity therebetween.

3. A module as claimed in claim 2, wherein, at least either one of said second and third semiconductor devices has upper and lower bump electrodes which are formed as protrusions respectively from the upper and lower surfaces of the package, and at least one other semiconductor device is mounted in a stacked manner.

4. An apparatus comprising:

a mounting substrate provided with a recess which can receive a semiconductor device, a first semiconductor device having a plurality of bump electrodes which protrude from a principal surface of said first semiconductor device and lead terminals electrically connected to the bump electrodes, and a second semiconductor device having a plurality of bump electrodes which protrude from a principal surface of said second semiconductor in such position as to be alignable with the bump electrodes of said first semiconductor device, wherein said second semiconductor device is physically located in the recess of said mounting substrate and wherein the bump electrodes are superposed on the bump electrodes of said first semiconductor and electrically connected thereto, and wherein said first semiconductor device is physically supported on said mounting substrate by the lead terminals.

* * * * *